United States Patent
Choi et al.

(10) Patent No.: US 6,197,388 B1
(45) Date of Patent: Mar. 6, 2001

(54) METHODS OF PREVENTING POST-ETCH CORROSION OF AN ALUMINUM NEODYMIUM-CONTAINING LAYER

(75) Inventors: Thomas S. Choi, San Jose; John P. Holland, Santa Josee; Nancy Tran, San Jose, all of CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/283,831

(22) Filed: Mar. 31, 1999

(51) Int. Cl.$^7$ .............................. H05H 1/24; C23D 1/20
(52) U.S. Cl. .................... 427/534; 427/535; 427/488; 427/64; 216/104; 216/49
(58) Field of Search .................... 427/534, 535, 427/488, 64; 216/102, 104, 49

(56) References Cited

U.S. PATENT DOCUMENTS

| | | |
|---|---|---|
| 4,208,241 | 6/1980 | Harshbarger et al. . |
| 4,325,984 * | 4/1982 | Galfo et al. .............................. 427/38 |
| 4,450,042 | 5/1984 | Purdes . |
| 4,490,209 | 12/1984 | Hartman . |
| 5,854,134 * | 12/1998 | Lan et al. .............................. 438/695 |
| 5,950,092 * | 9/1999 | Figura et al. .......................... 438/399 |

OTHER PUBLICATIONS

International Search Report, dated Jul. 26, 2000, for International Application No. PCT/US 00/08639.

Sung–Gu Kang, et al., "Advanced Dry Etch Processes for Use of Aluminum–alloys in AMLCDs", 1999 Display Manufacturing Technology Conf. Digest of Technical Papers, Feb. 3–4, 1999, pp. 64–65.

Kyu–Ha Baek, et al., "A Fluorine–related Passivation Layer on Etched Al–Cu (1%) Alloy Surfaces on Silicon after $SF_6$ Plasma Treatments", Materials Letters, NL, North Holland Publishing Company, Amsterdam, vol. 35, No. ¾, 1998–05–01, pp. 183–187.

Shuich Mayumi, et al., "Post–treatments for Reactive Ion Etching of Al–Si–Cu Alloys", Journal of the Electrochemical Society, vol. 137, No. 8, Aug. 1990, pp. 2534–2538.

Michael Lieberman and Allen Lichtenberg, Principles of Plasma Discharges and Material Processing, 1994, Wiley–Interscience Publication, New York, pp. 490–493, 506–509.

D.M. Manos and D.L. Flamm, eds. Plasma Etching, An Introduction, 1989, Academic Press, San Diego, pp. 152–155.

* cited by examiner

*Primary Examiner*—Shrive Beck
*Assistant Examiner*—Bret Chen
(74) *Attorney, Agent, or Firm*—Beyer Weaver & Thomas, LLP (57) ABSTRACT

A method for processing a substrate having an aluminum neodymium-containing layer is disclosed. The aluminum neodymium-containing layer has residual chlorine proximate to its etch surface. The method includes providing a first gas chemistry including HBr and $SF_6$ which supplies a first plurality of fluorine ions, forming a first plasma from said first gas chemistry, passivating the etch surface of the aluminum neodymium-containing layer with the first plasma to cause a second plurality of fluorine ions to replace a first portion of the residual chlorine. This second plurality of fluorine ions is a subset of the first plurality of fluorine ions. The method further includes providing a second gas chemistry having hydrofluorocarbon and oxygen which provides a third plurality of fluorine ions and oxygen, forming a second plasma with the second gas chemistry, bombarding the etch surface of the aluminum neodymium-containing layer with the second plasma, causing a fourth plurality of fluorine ions to replace a second portion of the residual chlorine. This fourth plurality of fluorine ions is a subset of the third plurality of fluorine ions. The method additionally includes depositing a polymer material using a third plasma having hydrofluorocarbon to coat the etch surface of the aluminum neodymium-containing layer.

20 Claims, 6 Drawing Sheets

METHODS OF PREVENTING POST-ETCH CORROSION OF AN ALUMINUM NEODYMIUM-CONTAINING LAYER

BACKGROUND OF THE INVENTION

The present invention relates to the manufacture of electronic devices. More particularly, the present invention relates to improved techniques for preventing the corrosion of an aluminum neodymium-containing layer during the manufacture of electronic devices.

In the manufacture of certain types of electro nic devices such as flat panel displays and the like, an aluminum neodymium-containing layer may be employed. Aluminum neodymium is the material of choice for manufacturing these devices due to its superior chemical and physical properties. But as with all aluminum alloys, corrosion remains a significant problem in the processing of aluminum neodymium in spite of its superior material characteristics.

Aluminum neodymium is generally etched with chlorine which results in residual chlorine adhering to the etch surface. When this etch surface comes in contact with the atmosphere, the residual chlorine reacts with moisture in the air to form hydrochloric acid. This hydrochloric acid eats away at the metal, which results in corrosion of that metal. The fundamental approach to resolving this problem is to remove the residual chlorine to prevent the formation of corrosive substances such as hydrochloric acid. Conventionally, this is accomplished by the use of a gas chemistry having $CF_4$ and oxygen. However, when $CF_4$ and $O_2$ are applied to prevent corrosion of aluminum neodymium, the high chlorine content in conjunction with the high ion energy required for the processing of this sturdy material requires a high ion energy level during removal of the residual chlorine. This in turn results in severe damage to the photoresist layer, which is an undesired side effect of the corrosion prevention process. Photoresist damage usually translates into hardened photoresist fragments on the substrate surface, which is harder to strip off in the later step of the manufacturing process. It is believed that high ion energy is necessary to remove the residual chlorine because high ion energy is used in the main etch, which results in the chlorine ions being embedded further in the etched surface than a conventional process where lower ion energy is used.

Figure 1:
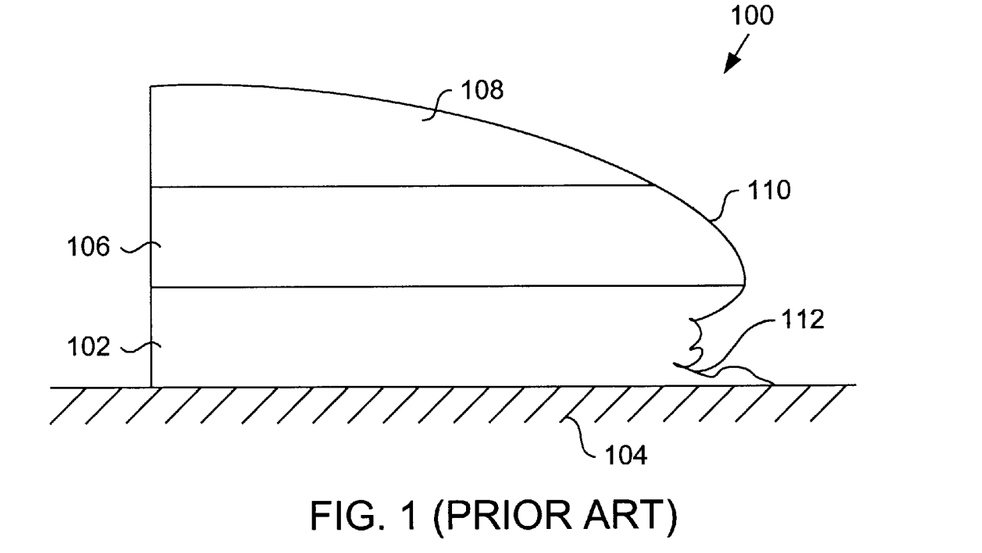
FIG. 1 illustrates the corrosive effects on an exemplary layer stack which includes an aluminum neodymium-containing layer that has not undergone corrosion prevention treatment.

FIG. 1 illustrates the corrosion problem occurring in an exemplary layer stack 100. Layer stack 100 has an aluminum neodymium-containing layer 102 disposed above a substrate 104, which may be, by way of example, glass. It should also be noted that the devices of the figures shown herein are depicted in a simplified format for illustration purposes only. There may be present other additional layers above, below, or in between the layers shown. Further, not all of the shown layers need necessarily be present and some or all may be substituted by other different layers. The layers of the devices shown and discussed herein are readily recognizable to those skilled in the art and may be formed using any of a number of suitable and known deposition processes, including chemical vapor deposition (CVD), plasma-enhanced chemical vapor deposition (PECVD), and a physical vapor deposition (PVD), such as sputtering.

An optional molybdenum layer 106 is disposed above aluminum neodymium-containing layer 102 and below a photoresist layer 108. Molybdenum layer 106 is not essential to the invention, but is included to show an example of a corrosion problem where an aluminum neodymium-containing layer is contained within a sandwich structure. A sandwich structure, for example, an aluminum neodymium-containing layer encapsulated in refractory metals such as molybdenum, is typically used to prevent hillock formation that might occur during processing steps and device operation. A refractory metal is a metal having an extremely high melting point, for example, tungsten, molybdenum, tantalum, niobium, and chromium, vanadium, and rhenium. In a broad sense, this term refers to metals having melting points above the range for iron, cobalt, and nickel. However, sandwich structures are often very prone to corrosion, in fact, the severity of corrosion problems in a sandwich structure is greater by orders of magnitude compared to the corrosion problem of an aluminum neodymium-containing layer that is not within a sandwich structure.

The chlorine component in the etchant gas chemistry adheres to the etched surface 110 and forms hydrochloric acid when it comes in contact with moisture in the air. The hydrochloric acid reacts with the aluminum neodymium-containing layer to cause corrosion as shown in exposed portion 112 of aluminum neodymium-containing layer 102.

Figure 2:
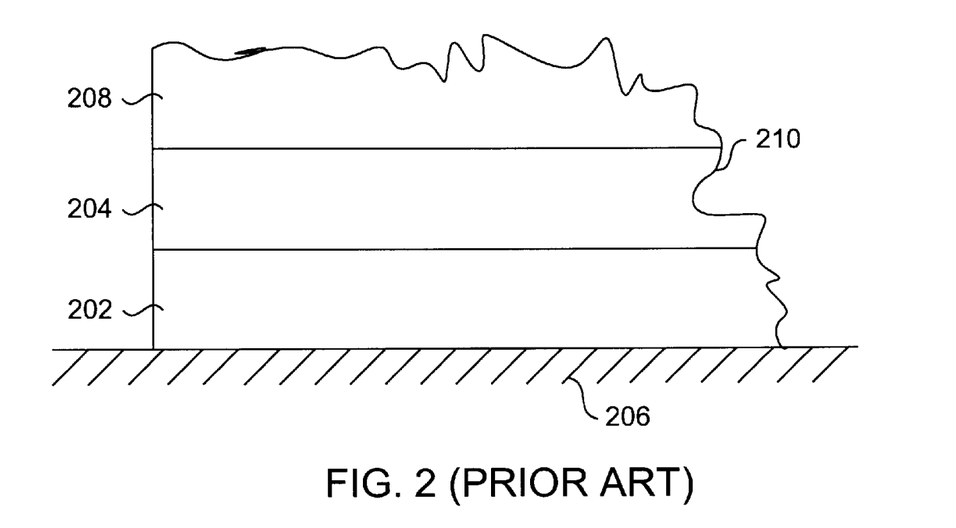
FIG. 2 depicts an exemplary layer stack which includes an aluminum neodymium-containing layer that has been treated with the traditional $CF_4/O_2$ gas chemistry to prevent corrosion.

FIG. 2 illustrates the situation where an exemplary layer stack 200 having an aluminum neodymium-containing layer 202 disposed below an optional molybdenum layer 204 and above a substrate 206 is treated by the traditional method of using $CF_4$ and $O_2$ to prevent corrosion. While corrosion is successfully prevented, the process has the unfortunate side effect of severely degrading the photoresist layer 208. Severe degradation of photoresist layer 208 may cause unwanted hardening of the photoresist material, which makes subsequent removal of photoresist layer 208 very difficult. Moreover, some of the hardened resist may deposit on sidewalls and other areas, masking certain regions that were designated to be unmasked for the purpose of etching, which causes the formation of jagged sidewalls 210 along aluminum neodymium-containing layer 202 and molybdenum layer 204 as well as severe residue problems.

In view of the foregoing, what are desired are improved methods for preventing corrosion in an aluminum neodymium-containing layer. These improved techniques preferably would prevent corrosion along the etched surface of the aluminum neodymium-containing layer while avoiding problems such as severe degradation of the photoresist layer which might lead to other serious problems.

SUMMARY OF THE INVENTION

The invention relates, in one embodiment, to a method for preventing post-etch corrosion in an etch surface of an aluminum neodymium-containing layer. The method includes providing a first gas chemistry having HBr and $SF_6$ which supplies the fluorine ions, forming a first plasma with the first gas chemistry, and passivating the etch surface of the aluminum neodymium-containing layer with the first plasma to cause at least some of the fluorine ions to replace at least some of the residual chlorine proximate to the etch surface. The method further includes providing a second gas chemistry having hydrofluorocarbon, forming a second plasma with the second gas chemistry; and depositing a polymer material using the second plasma to coat the etch surface of the aluminum neodymium-containing layer.

In another embodiment, the invention relates to a method of processing a substrate having an aluminum neodymium-containing layer having residual chlorine proximate to an etch surface of the aluminum neodymium-containing layer. The method includes providing a first gas chemistry including HBr and $SF_6$ which supplies a first plurality of fluorine ions, forming a first plasma from said first gas chemistry, passivating the etch surface of the aluminum neodymium-containing layer with the first plasma to cause a second plurality of fluorine ions to replace a first portion of the residual chlorine. This second plurality of fluorine ions is a subset of the first plurality of fluorine ions. The method further includes providing a second gas chemistry having hydrofluorocarbon and oxygen which provides a third plurality of fluorine ions, forming a second plasma with the second gas chemistry, bombarding the etch surface of the aluminum neodymium-containing layer with the second plasma, causing a fourth plurality of fluorine ions to replace a second portion of the residual chlorine. This fourth plurality of fluorine ions is a subset of the third plurality of fluorine ions. The method additionally includes depositing a polymer material using a third plasma formed from a hydrofluorocarbon gas chemistry to coat the etch surface of the aluminum neodymium-containing layer.

In yet another embodiment, the invention relates to a method of preventing post-etch corrosion in an etch surface of an aluminum neodymium-containing layer having residual chlorine proximate to the etch surface. The method includes providing a first gas chemistry having hydrofluorocarbon and oxygen which provides a plurality of fluorine ions, forming a first plasma from the gas chemistry, bombarding the etch surface of the aluminum neodymium-containing layer with the first plasma to cause at least some of the plurality of fluorine ions to replace a portion of the residual chlorine. The method further includes depositing a polymer material using a second plasma formed from a hydrofluorocarbon gas chemistry to coat the etch surface of the aluminum neodymium-containing layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

FIGS. 6($a$)–($c$) show flowcharts outlining the steps of the inventive methods in accordance with an embodiment of the present invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of the specific details. In other instances, well known process steps and/or structures have not been described in detail in order to not unnecessarily obscure the present invention.

In accordance with one embodiment of the present invention, there is provided a method of preventing post-etch corrosion in an etch surface of an aluminum neodymium-containing layer. A first gas chemistry having HBr and $SF_6$ forms a first plasma with $SF_6$ supplying the fluorine ions. The first plasma is used to passivate the etch surface of the aluminum neodymium-containing layer to replace at least some of the residual chlorine with fluorine ions. A second gas chemistry having hydrofluorocarbon is then provided to form a second plasma, which is used to deposit a polymer material to coat the etch surface of the aluminum neodymium-containing layer.

In accordance with another aspect of the present invention, there is provided a method of processing a substrate having an aluminum neodymium-containing layer having residual chlorine proximate to an etch surface of the aluminum neodymium-containing layer. A first gas chemistry including HBr and $SF_6$ forms a first plasma. The first plasma performs the function of passivating the etch surface of the aluminum neodymium-containing layer, causing some of the fluorine ions supplied by $SF_6$ to replace at least some of the residual chlorine. A second gas chemistry having hydrofluorocarbon and oxygen forms a second plasma, which bombards the etch surface of the aluminum neodymium-containing layer, causing some of fluorine ions supplied by the hydrofluorocarbon to replace some of the residual chlorine that was not displaced by the previous passivation step. A third gas chemistry having hydrofluorocarbon forms a third plasma, which is used to deposit a polymer material to coat the etch surface of the aluminum neodymium-containing layer.

In accordance with yet another aspect of the invention, there is provided a method of preventing post-etch corrosion in an etch surface of an aluminum neodymium-containing layer having residual chlorine proximate to the etch surface. A first gas chemistry having hydrofluorocarbon and oxygen is provided to form a first plasma. The first plasma is used to bombard the etch surface of the aluminum neodymium-containing layer to cause at least some of the fluorine ions to replace some of the residual chlorine. Then using a second plasma formed from a second gas chemistry having hydrofluorocarbon, a polymer material is then deposited to coat the etch surface of the aluminum neodymium-containing layer.

The present invention includes a number of steps that are applied in various different combinations to treat the aluminum neodymium-containing layer in order to prevent corrosion. Each exemplary layer stack depicted in FIGS. 3, 4 and 5 has an aluminum neodymium-containing layer disposed above a substrate and below an optional molybdenum layer. The optional molybdenum layer, which has a photoresist mask disposed over it, is included in each figure to emphasize the importance of this invention when applied to sandwich structures, which have corrosion problems that are more severe by an order of magnitude in comparison with an isolated aluminum alloy layer. However, the invention is not so limiting and the invention applies even in the absence of a refractory metal layer such as the optional molybdenum layer.

Figure 3:
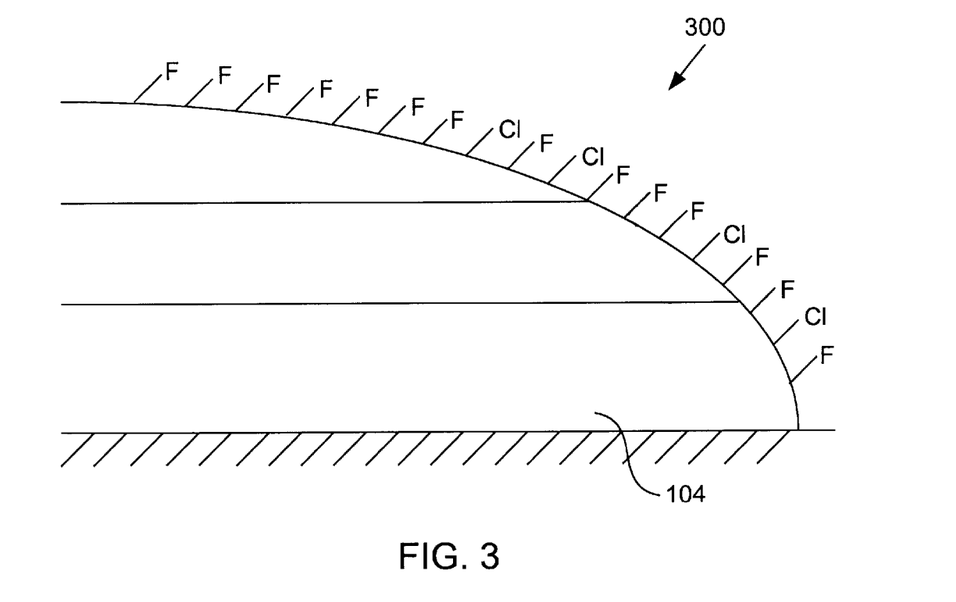
FIG. 3 depicts an exemplary layer stack which includes an aluminum neodymium-containing layer that has been treated with one step of the inventive corrosion prevention method using passivation with an $HBr/SF_6$ gas chemistry to replace the residual chlorine ions with fluorine ions.

FIG. 3 shows an exemplary layer stack 300 having an aluminum neodymium-containing layer 302 that has been treated with one step of the inventive corrosion prevention method. This step involves passivating the etched surface with an $HBr/SF_6$ gas chemistry to replace the residual chlorine ions with fluorine ions. The heavier bromine ions are used to dislodge the residual chlorine to replace them with the more reactive fluorine ions. This gas chemistry, which is composed largely of HBr with a small amount of $SF_6$, was first used in an overetch step.

Overetching refers to the additional etching of the target film after the main etch to ensure complete removal of the target film materials from exposed areas. The $HBr/SF_6$ gas chemistry provides a slow etch rate, which is ideal for overetching since it is a very controlled etch compared to the very aggressive main etch. The overetching process is necessary because most main etch processes do not have a perfect 0% etch rate uniformity, which results in certain areas being etched less than others. If the aggressive main etch were employed to etch the relatively unetched areas, the result would be an underlying film having uneven step coverage, among other undesirable characteristics. This gives rise to the need for a less aggressive overetching process to achieve a product with the desired characteristics. It should be made clear that the overetching process is not limited to this particular method or gas chemistry. Overetching may be accomplished by alternative means, for example, an alternative overetching process is similar to the main etch except the power and the gas flow used in the main etch process is scaled down during the overetch. Unlike an overetch using the $HBr/SF_6$ gas chemistry, this alternative overetching process, which is essentially a scaled down version of the main etch process, does not passivate the etch surface. This alternative overetch process may be used in instances where the $HBr/SF_6$ chemistry is not used in a corrosion prevention treatment or alternatively, where the $HBr/SF_6$ is used exclusively as a corrosion prevention process and does not play a role in the overetching process.

The $HBr/SF_6$ gas chemistry was found to be very effective in promoting plasma passivation along the etched surface, which in turn achieves the prevention of corrosion. The fluorine ions provided by the $HBr/SF_6$ chemistry serve to replace the residual chlorine and to passivate the etch surface by coating the sidewalls with a non-volatile product of the gas chemistry.

Figure 4:
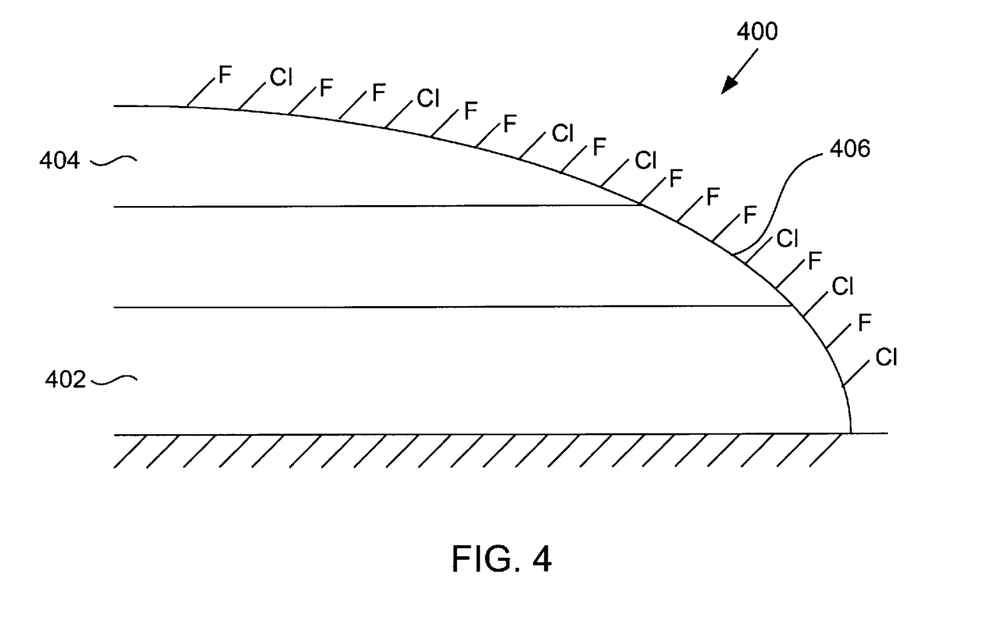
FIG. 4 depicts an exemplary layer stack which includes an aluminum neodymium-containing layer that has been treated with another step of the inventive corrosion prevention method using ion bombardment with a gas chemistry having hydrofluorocarbon and oxygen to replace the residual chlorine ions with fluorine ions.

FIG. 4 depicts an exemplary layer stack 400 which includes an aluminum neodymium-containing layer 402 that has been treated with another step of the inventive corrosion prevention method using ion bombardment with a gas chemistry having hydrofluorocarbon and oxygen to replace the residual chlorine ions with fluorine ions. The hydrofluorocarbon may be, by way of example, $CHF_3$ or $C_2HF_5$, and the oxygen may be, for example, $O_2$ or Ozone. The hydrofluorocarbon and oxygen react to release fluorine ions, which in turn displace the residual chlorine proximate to the etched surface and the photoresist mask. The displacement takes place by the fluorine ions that were released by the chemical reaction of hydrofluorocarbon and oxygen. These fluorine ions and oxygen remove the residual chlorine that is embedded in the photoresist layer 404 and the etched aluminum sidewall 406 by use of physical bombardment during the treatment. Bombardment may be achieved by employing radio frequency bias power applied to the workpiece holder on which the substrate sits. In essence, the second step involving the hydrofluorocarbon and oxygen has an equivalent function to that of the step previously described using an $HBr/SF_6$ gas chemistry, since both perform the function of displacing the residual chlorine. Therefore, it is conceivable that both steps can be used in combination or either step can be used alone. However, it might be more practical and efficient to use this approach as opposed to the $HBr/SF_6$ chemistry in certain situations, by way of example, if the $HBr/SF_6$ chemistry has not been used in a previous step, for example, in an overetch process, or if the hydrofluorocarbon and oxygen chemistry must still be provided to implement for the next step which will be detailed as follows.

Figure 5:
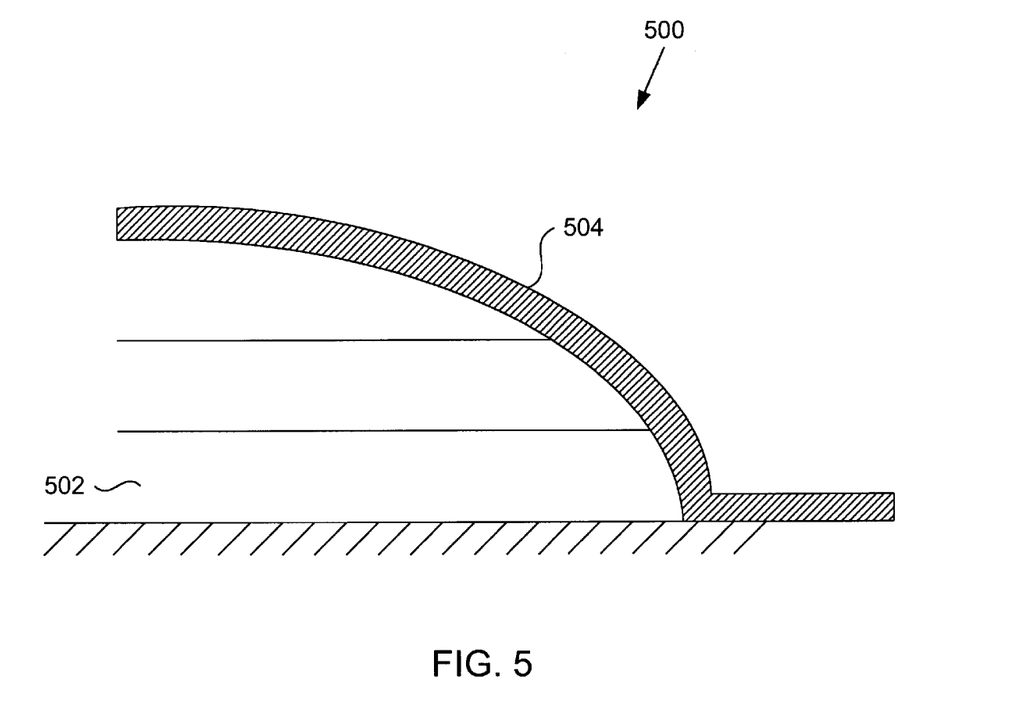
FIG. 5 depicts an exemplary layer stack which includes an aluminum neodymium-containing layer that has been treated with yet another step of the inventive corrosion prevention method using a gas chemistry having hydrofluorocarbon to form a polymer film over the etched surface.

FIG. 5 depicts an exemplary layer stack 500 which includes an aluminum neodymium-containing layer 502 that has been treated with yet another step of the inventive corrosion prevention method using a gas chemistry having hydrofluorocarbon to form a polymer film 504 over the etched surface. This step utilizes a polymer generating chemistry and usually takes place after either or both of the two steps described earlier. As mentioned earlier in the previous step, the hydrofluorocarbon may be, by way of example, $CHF_3$ or $C_2HF_5$. In this step, the etched surface is coated with a polymer film that protects the etched features from moisture. The coating treatment forms a protective layer around the freshly etched surface, which prevents any residual chlorine that is still present from reacting with the moisture in the air to form hydrochloric acid, which in turn might cause corrosion of the aluminum neodymium-containing layer. In fact, FIG. 5 illustrates exemplar results after the entire inventive post-etch corrosion treatment.

Figure 6A:
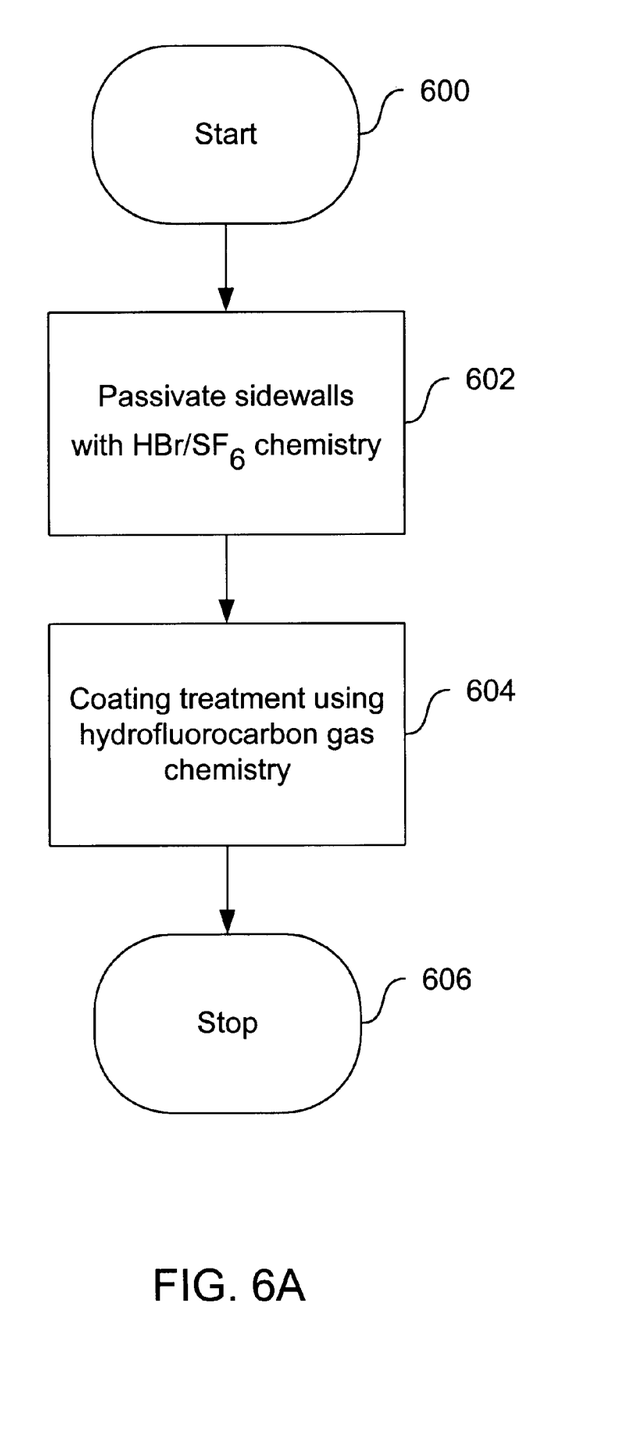

FIG. 6 shows a flow chart outlining the steps of the inventive method in accordance with one embodiment of the present invention. Looking at FIG. 6(a), the process starts at step 600, followed by step 602 where the sidewalls are passivated using the $HBr/SF_6$ chemistry. The $HBr/SF_6$ chemistry may also already serve another purpose, namely for use in an over etch application. This passivation process 602, may be followed by coating treatment 604. In coating step 604, a thin film is deposited over the etch surface using a gas chemistry having hydrofluorocarbon to form a protective barrier layer. The protective barrier layer serves the function of preventing any residual chlorine from reacting with moisture in the air to form hydrochloric acid, which in turn, might corrode the aluminum neodymium-containing layer. The process ends with step 606.

Figure 6B:
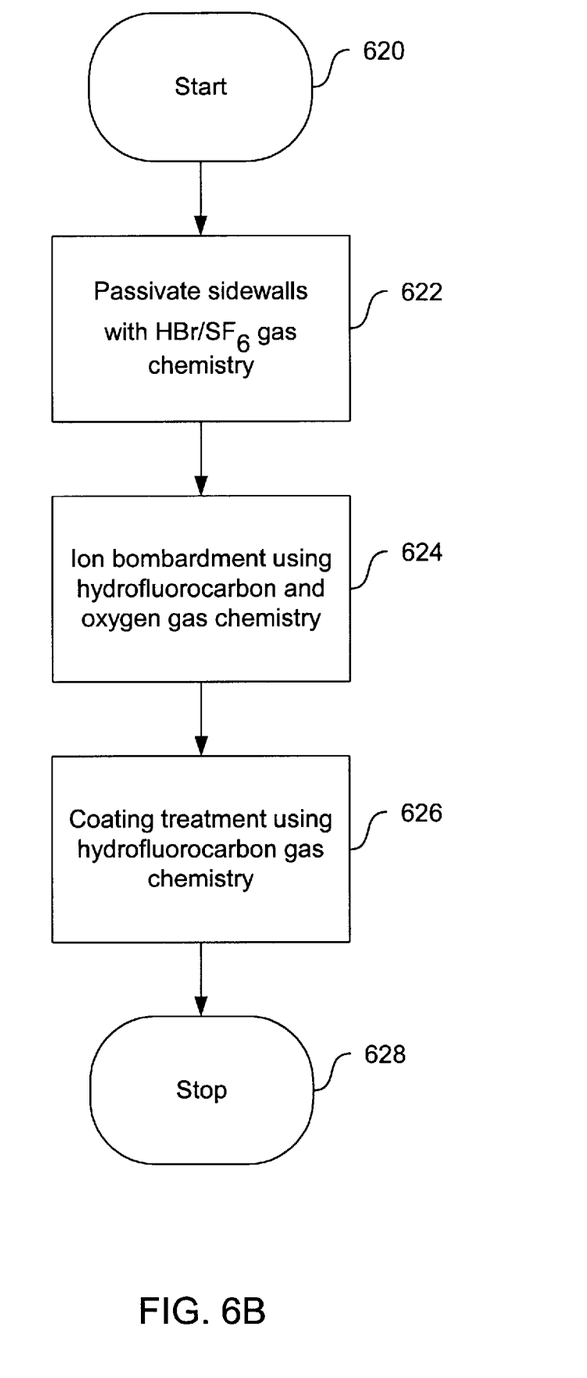

FIG. 6(b) shows a flow chart outlining the steps of the inventive method in accordance with a second embodiment of the present invention. In FIG. 6(b), the process begins at step 620. In step 622, the sidewalls are passivated using the $HBr/SF_6$ chemistry, followed by ion bombardment using the hydrofluorocarbon and oxygen chemistry in step 624. Step 624 is followed by step 626, which is a coating treatment utilizing a hydrofluorocarbon gas chemistry to form a thin film which serves as a protective barrier over the etch surface. This embodiment of a corrosion prevention process ends with step 628.

Figure 6C:
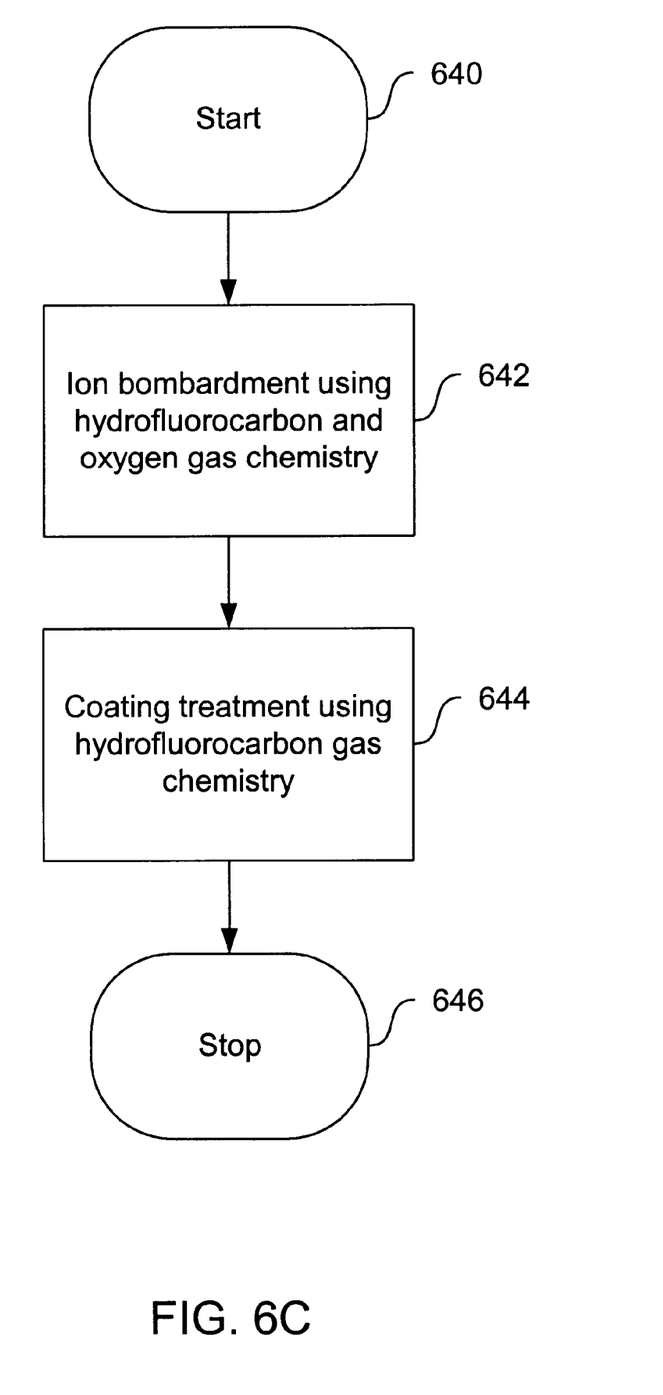

FIG. 6(c) shows a flow chart outlining the steps of the inventive method in accordance with a third embodiment of the present invention. The process begins with step 640, followed by step 642 where the etched surface undergoes ion bombardment with a hydrofluorocarbon and oxygen gas chemistry. Step 642 serves the function of replacing the residual chlorine with fluorine ions, which do not react as readily with the other elements in the atmosphere to form corrosive elements that might damage the aluminum neodymium-containing layer. Step 642 is followed by step 644, which is a coating treatment using a hydrofluorocarbon chemistry to form a thin film which serves as a protective barrier over the etch surface. This particular embodiment of a corrosion prevention process ends with step 626.

EXAMPLES

In the following, suitable parameters for preventing corrosion in an exemplar layer stack having an aluminum neodymium-containing layer using the inventive technique are shown. The approximate process parameters shown therein are generally suitable for use in preventing corrosion during the processing of a flat panel display on a Continuum™ inductively coupled plasma reactor available from Lam Research of Fremont, Calif. It should be readily apparent and within the skills of one skilled in the art that the parameters may be scaled and/or modified as appropriate to treat a substrate having a different dimension or to conform to the requirements of a specific plasma reactor.

The table below provides approximate ranges and approximate examples of suitable parameters for use in the plasma reactor such as top electrode power (in watts), bias power (in watts), chamber pressure (in mTorr), backside helium pressure (in Torr), electrode temperature (in ° C.), HBr, $SF_6$, $C_xH_yF_z$ and $O_2$ flow rates (in sccm) and HBr: $SF_6$ and $C_xH_yF_z$:$O_2$ ratios.

TABLE

| Variables/Ranges | Approximate Preferred | Approximate More Preferred | Approximate Exemplary Parameters |
| --- | --- | --- | --- |
| Top Electrode Power (W) | 1500–4000 | 2500–3500 | 3000 |
| Bias Power (W) | 500–2000 | 800–1200 | 1000 |
| Pressure (mTorr) | 5–20 | 5–12 | 10 |
| HBr flow (sccm) | 200–400 | 250–350 | 300 |
| $SF_6$ flow (sccm) | 10–150 | 30–100 | 100 |
| $C_xH_yF_z$ flow (sccm) | 100–400 | 150–300 | 200 |
| $O_2$ flow (sccm) | 100–400 | 150–300 | 200 |
| Electrode Temperature (° C.) | 20° C.–60° C. | 30° C.–50° C. | 40° C. |
| Backside Helium Pressure (T) | 2–6 | 3–5 | 4 |
| HBr:$SF_6$ | 99:1–1:10 | 99:1–1:5 | 3:1 |
| $C_xH_yF_z$:$O_2$ | 99:1–1:2 | 10:1–1:1 | 1:1 |

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of processing a substrate having an aluminum neodymium-containing layer, an etch surface of said aluminum neodymium-containing layer having residual chlorine proximate to said etch surface of said aluminum neodymium-containing layer, comprising:

providing a first gas chemistry including HBr and $SF_6$, said $SF_6$ supplying a first plurality of fluorine ions;

forming a first plasma from said first gas chemistry;

passivating said etch surface of said aluminum neodymium-containing layer with said first plasma, said passivation causing a second plurality of said fluorine ions to replace a first portion of said residual chlorine, said second plurality of said fluorine ions being a subset of said first plurality of said fluorine ions;

providing a second gas chemistry having hydrofluorocarbon and oxygen, said hydrofluorocarbon providing a third plurality of fluorine ions;

forming a second plasma with said second gas chemistry;

bombarding said etch surface of said aluminum neodymium-containing layer with said second plasma, said bombarding causing a fourth plurality of said fluorine ions to replace a second portion of said residual chlorine, said fourth plurality of said fluorine ions being a subset of said third plurality of said fluorine ions; and providing a third gas chemistry having hydrofluorocarbon, forming a third plasma with said third gas chemistry;

depositing a polymer material using said third plasma to coat said etch surface of said aluminum neodymium-containing layer.

2. The method of claim 1, wherein said bombarding is achieved via RF bias power applied to a workpiece holder supporting said substrate.

3. The method of claim 2, wherein said RF bias power is between about 500 W and about 2000 W.

4. The method of claim 1, where said hydrofluorocarbon is $CHF_3$.

5. The method of claim 1, where said hydrofluorocarbon is $C_2HF_5$.

6. The method of claim 1, wherein a refractory metal layer is disposed above said aluminum neodymium-containing layer.

7. The method of claim 6, wherein said refractory metal layer is formed from one of tungsten, molybdenum, tantalum, niobium, and chromium.

8. The method of claim 1, wherein said first gas chemistry consists essentially of said HBr and said $SF_6$.

9. The method of claim 1, wherein a flow ratio of said HBr to said $SF_6$ is greater than about 3:1.

10. The method of claim 1, wherein said second gas chemistry consists essentially of said hydrofluorocarbon and said oxygen.

11. The method of claim 1, wherein said substrate having said aluminum neodymium-containing layer is employed to fabricate a flat display panel.

12. A method of preventing post-etch corrosion in an etch surface of an aluminum neodymium-containing layer, said etch surface of said aluminum neodymium-containing layer having residual chlorine proximate to said etch surface of said aluminum neodymium-containing layer, comprising:

providing a first gas chemistry having hydrofluorocarbon and oxygen, said hydrofluorocarbon providing a plurality of fluorine ions;

forming a first plasma from said first gas chemistry;

bombarding said etch surface of said aluminum neodymium-containing layer with said plasma, said bombarding causing at least some of said plurality of said fluorine ions to replace a portion of said residual chlorine;

providing a second gas chemistry having hydrofluorocarbon;

forming a second plasma from said second gas chemistry;

depositing a polymer material using said second plasma to coat said etch surface of said aluminum neodymium-containing layer.

13. The method of claim 12, wherein said bombarding is achieved via RF bias power applied to a workpiece holder supporting said substrate.

14. The method of claim 12, wherein said RF bias power is between about 500 W and about 2000 W.

15. The method of claim 12, where said hydrofluorocarbon is $CHF_3$.

16. The method of claim 12, where said hydrofluorocarbon is $C_2HF_5$.

17. The method of claim 12, wherein a refractory metal layer is disposed above said aluminum neodymium-containing layer.

18. The method of claim 17, wherein said refractory metal layer is formed from one of tungsten, molybdenum, tantalum, niobium, and chromium.

19. The method of claim 12, wherein said first gas chemistry consists essentially of said hydrofluorocarbon and said oxygen.

20. The method of claim 12, wherein said aluminum neodymium-containing layer is part of a substrate that is employed to fabricate a flat display panel.

* * * * *